United States Patent [19]

Chomette et al.

[11] Patent Number: 6,028,752
[45] Date of Patent: Feb. 22, 2000

[54] MINIATURE DEVICE FOR RECEIVING AND PLAYING BACK SOUND WITH PIEZOELECTRIC COMPONENT AS COMBINATION MICROPHONE/LOUD SPEAKER

[75] Inventors: Michel Chomette, La Colle Sur Loup; Jean-Francois Vaccani, Roquefort-Les-Pins; Philippe Tort, Nice, all of France

[73] Assignee: Texas Instruments Incorporated, Dallas, Tex.

[21] Appl. No.: 08/907,823

[22] Filed: Aug. 14, 1997

Related U.S. Application Data

[63] Continuation of application No. 08/081,498, Jun. 22, 1993, abandoned.

[30] Foreign Application Priority Data

Jun. 22, 1992 [FR] France ................................. 92 07 587

[51] Int. Cl.[7] .................................................. H04M 1/65
[52] U.S. Cl. ...................... 360/137; 369/64; 40/124.03; 40/455
[58] Field of Search ......................... 360/137; 369/63–65, 369/68; 40/455, 457, 906, 124.03; 381/88, 114, 173

[56] References Cited

U.S. PATENT DOCUMENTS

| 4,471,258 | 9/1984 | Kumada | 310/345 |
|---|---|---|---|
| 4,618,896 | 10/1986 | Rusyniak | 360/137 |
| 4,715,060 | 12/1987 | Lipscher et al. | 379/70 |
| 4,791,741 | 12/1988 | Kondo | 369/64 |
| 5,063,698 | 11/1991 | Johnson et al. | 40/455 |
| 5,115,472 | 5/1992 | Park et al. | 40/455 |
| 5,166,851 | 11/1992 | Jacobson | 360/137 |

FOREIGN PATENT DOCUMENTS

| 0 277 276 | 8/1988 | European Pat. Off. | |
| 2417229 | 10/1979 | France | 381/88 |
| 2613863 | 10/1988 | France | 40/906 |
| 2 615 984 | 12/1988 | France . | |
| 2 624 636 | 6/1989 | France . | |
| 2 629 621 | 10/1989 | France . | |
| 8 800 801 | 9/1988 | Germany . | |
| 53-32717 | 3/1978 | Japan | 381/173 |
| 57-65092 | 4/1982 | Japan | 381/173 |

OTHER PUBLICATIONS

Patent Abstracts of Japan, vol. 13, No. 152 (P–856) Apr. 13, 1989, & JP–A–63 313 398 (Tatsuta Electric Wire & Cable Co Ltd) Dec. 21, 1988.

*Primary Examiner*—Jefferson Evans
*Attorney, Agent, or Firm*—Richard L. Donaldson; William B. Kempler

[57] ABSTRACT

Sound recording and playback device comprising a sound pick-up microphone connected to a recording channel and a playback loudspeaker connected to a channel for playing the recorded sounds, characterised in that the microphone and the loudspeaker consist of one and the same component (5).

6 Claims, 5 Drawing Sheets

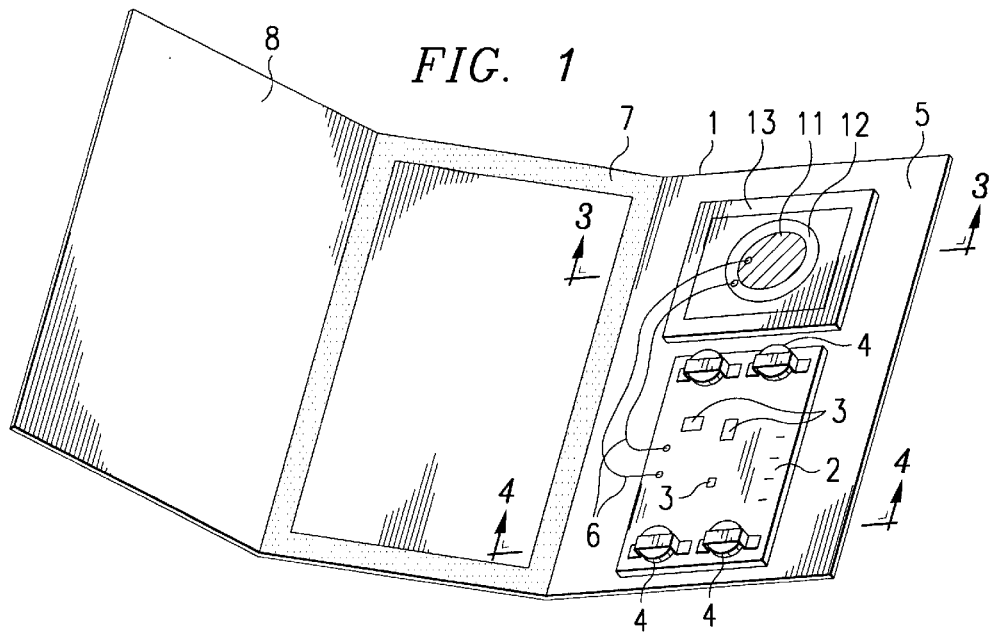
FIG. 1
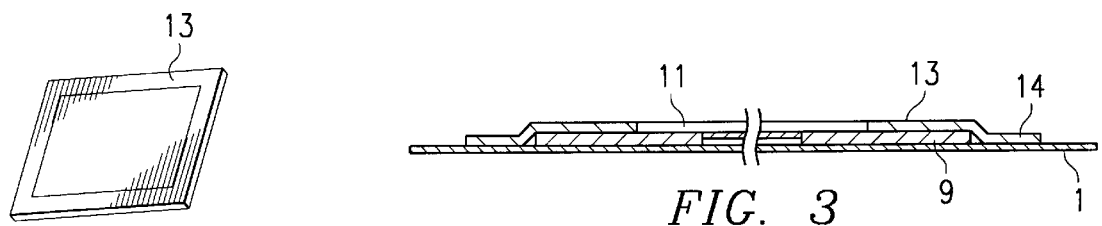
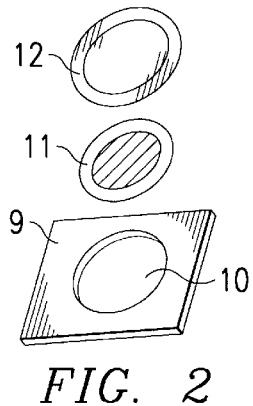
FIG. 2
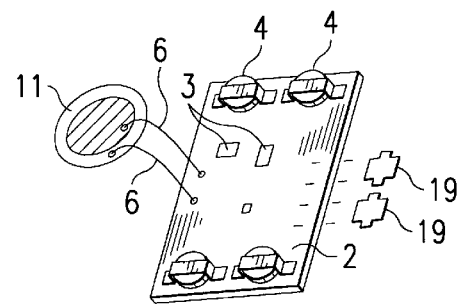
FIG. 3
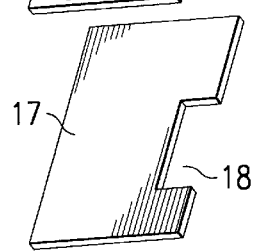
FIG. 4
FIG. 5

REC: RECORD KEY
PLBCK: PLAYBACK KEY
EM: END OF MEMORY

REC: RECORD KEY
PLBCK: PLAYBACK KEY
ERA: ERASE KEY
STOP: STOP KEY
EM: END OF MEMORY

20

MINIATURE DEVICE FOR RECEIVING AND PLAYING BACK SOUND WITH PIEZOELECTRIC COMPONENT AS COMBINATION MICROPHONE/LOUD SPEAKER

This application is a Continuation of application Ser. No. 08/081,498 filed Jun. 22, 1993, now abandoned.

The present invention relates to sound recording and playback and more particularly concerns a small-sized recording and playback device which can be kept in a card of the credit card or similar type.

Small-sized sound recording and playback devices are known which include a microphone for recording and a loudspeaker for playback.

The known devices of this type include, in a plastic package, a microphone of electret type, a magnetic loudspeaker with diaphragm, an assembly of supply cells, an integrated circuit for speech coding, one or more integrated circuits for storage, an interface circuit, a quartz oscillator and associated discrete components, as well as a control keypad.

The presence within a single device of this type of a microphone and a loudspeaker limits the possibilities for miniaturisation thereof, increases the weight thereof especially by reason of the presence of relatively voluminous cells, and renders it relatively fragile to shocks.

The stored messages are volatile in the event of a stoppage, even momentary, of the electrical supply.

The reliability of the device is reduced owing to the high number of components, the sizable disparity in their respective masses and the heterogeneity of the necessary techniques of assemblage.

The invention aims to remedy the aforesaid disadvantages of the known devices by creating a sound recording and playback device which, owing to the reduction in number of the components thereof, may be miniaturised optimally.

Its subject is therefore a sound recording and playback device comprising a sound pick-up microphone connected to a recording channel and a playback loudspeaker connected to a channel for playing the recorded sounds, characterised in that the microphone and the loudspeaker consist of one and the same component.

According to a particular characteristic of the invention, the said component is a piezoelectric component.

The invention will be better understood with the aid of the description which will follow, given merely by way of example and made with reference to the attached drawings, in which:

FIG. 1 is a perspective view of a sound recording and playback device according to the invention in the form of a speaking postcard, during set-up;

FIG. 2 is an exploded perspective view of the set-up of the piezoelectric component forming a microphone and a loudspeaker in the device of FIG. 1;

FIG. 3 is a transverse sectional view on a larger scale along the line 3—3 of FIG. 1;

FIG. 4 is a transverse sectional view on a larger scale along the line 4—4 of FIG. 1;

FIG. 5 is an exploded perspective view showing the various plates constituting the device of FIG. 1;

Figure 6:
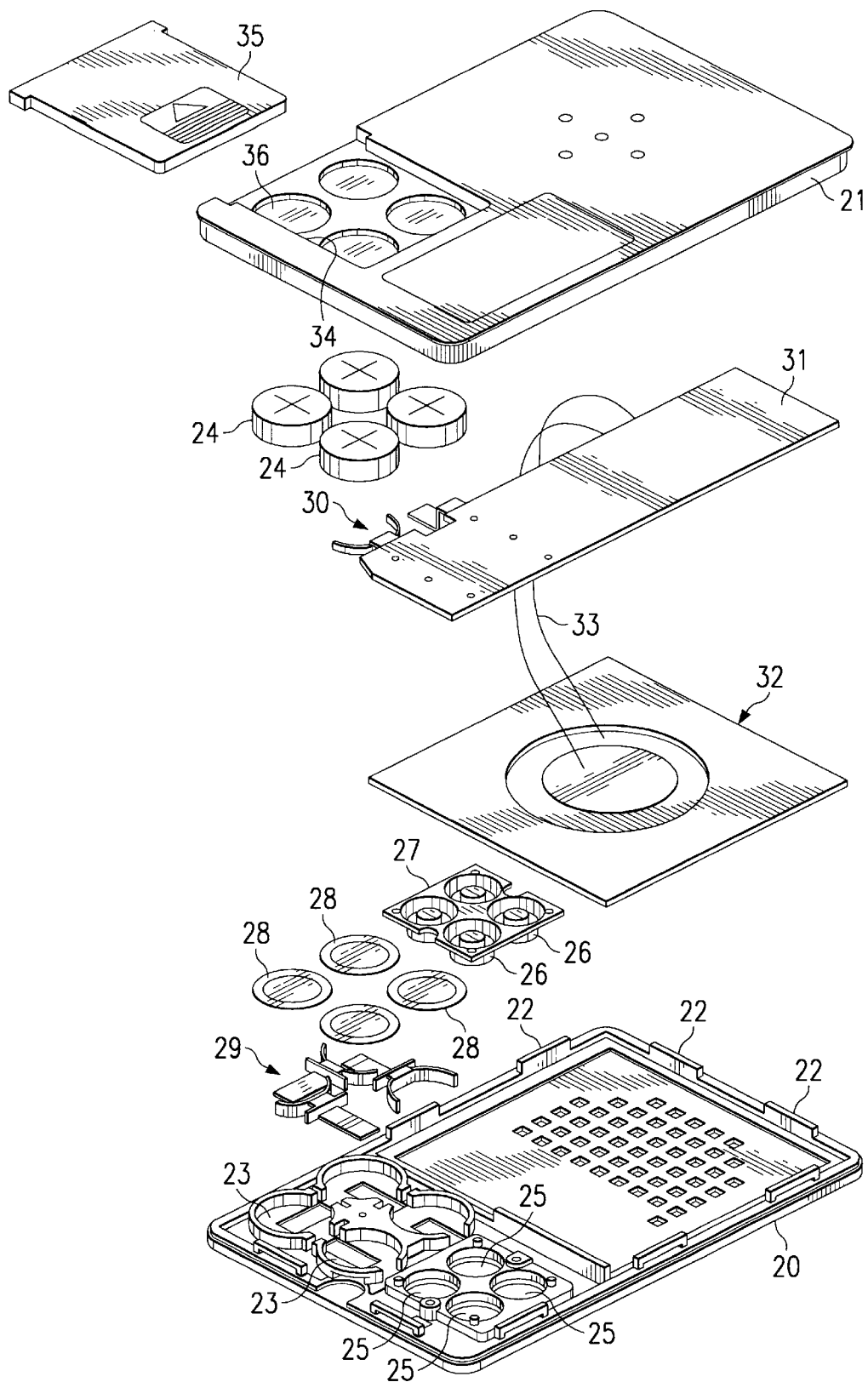
FIG. 6 is an exploded perspective view of an embodiment of the sound recording and playback device according to the invention.

In FIG. 1 has been represented, during unfolded production, a first embodiment of the device according to the invention forming a speaking postcard.

This device comprises a support plate 1 made of an insulating material on which is mounted a printed circuit board 2 which carries the electronic circuits 3 of the device and which are made in the form of integrated circuit chips and supply cells 4 and, next to the board 2, an assembly 5 forming a microphone and a loudspeaker and which is connected to the printed circuit board 2 by conductors 6.

The device furthermore includes a double-sided adhesive foam frame 7 intended to be fixed to the periphery of the support plate 1 so as to surround all the components fixed on this plate.

A protective sheet 8 is fixed to the assembly thus constituted.

The microphone-loudspeaker assembly 5 represented in FIG. 2 includes a foam mount 9 having a hole 10 in which is arranged a piezoelectric element intended to afford the dual function of microphone and loudspeaker.

This dual function can also be afforded by a different element, for example an electromagnetic element.

The piezoelectric element 11 is held in the foam mount by means of a ring 12 of flexible adhesive material. The assembly is arranged in a cardboard frame 13.

FIG. 3 is a sectional view on a larger scale of the microphone-loudspeaker assembly of FIG. 2, in the assembled condition.

The foam mount 9 in which the piezoelectric element 11 is arranged is seen therein. The mount 9 is held in place by the cardboard frame 13 which includes a peripheral rim 14 in contact with the support plate 1.

In FIGS. 4 and 5 have been represented the mode of fixing the supply cells 4 of the device to the printed circuit board 2.

The cells 4 are fixed to the board 2 by means of brackets 16.

The board 2 is itself fastened to the support plate 1 by a double-sided adhesive foam sheet 17.

Reference to FIG. 5 which is an exploded perspective view of that part of the device of FIG. 1 which is mounted on the printed circuit board 2, shows that the foam adhesive element 17 has, on one of its edges, a notch 18 intended for the placement of two control switches 19 connected to the printed circuit board 2.

In FIG. 6 has been represented in exploded perspective a particular embodiment of the recording and playback device in a very flat package in, for example, credit card form.

This package consists of two elements 20, 21 which can be assembled by clip means, 22 certain of which are visible on the part 20.

In the part 20 of the package are made sites 23 for receiving cells 24 as well as sites 25 for on/off control switch buttons 26 carried by a common mount 27. Insulating washers 28 are interposed between the batteries 24 and the bottoms of their housings 23. Elements 29 for contact with the assembly of cells are intended to cooperate with complementary contact elements 30 fixed to a printed circuit board 31 to which is connected a microphone-loudspeaker assembly 32, by way of conductors 33 in a manner already described with reference to FIG. 1.

The upper part 21 of the package includes a recess 34 into which is engaged a cover 35 masking passages 36 for the cells intended to be housed in the housings 23 of the lower part 20.

Figure 7:
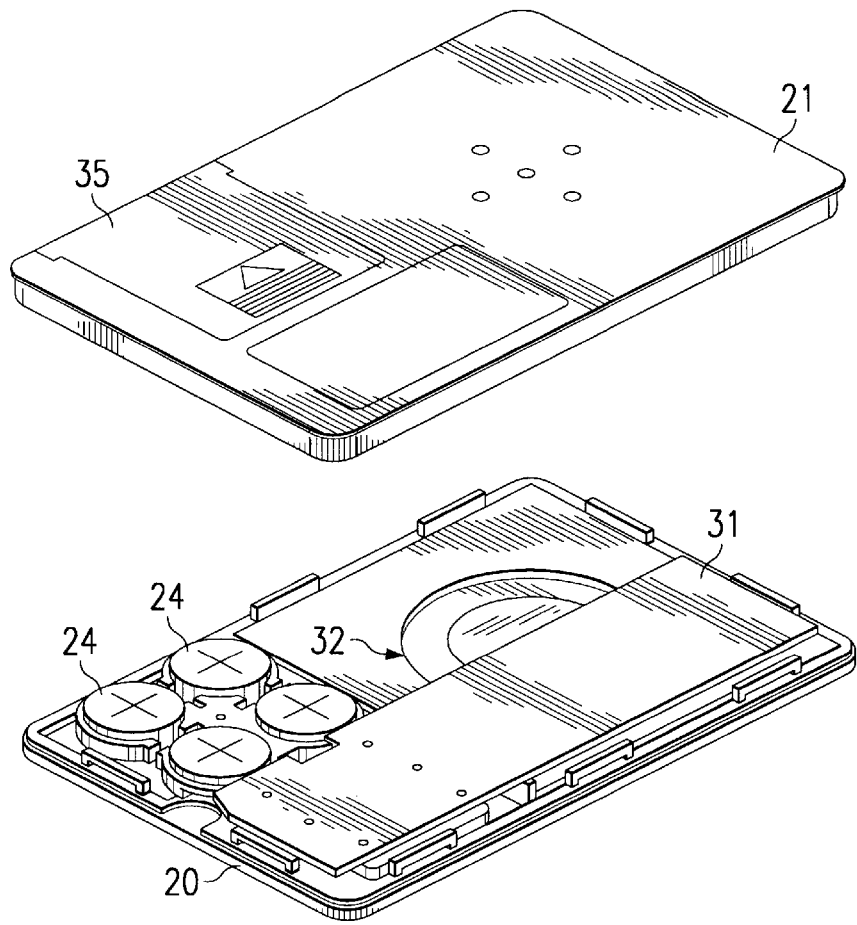
FIG. 7 is an exploded perspective view of the device of FIG. 6 most of whose components have been assembled.

FIG. 7 shows the assembly of the components of the device described in FIG. 6, and housed in the first part 20 of the package, whereas the second part 21 of the latter is ready to be fixed to this first part.

Figure 8:
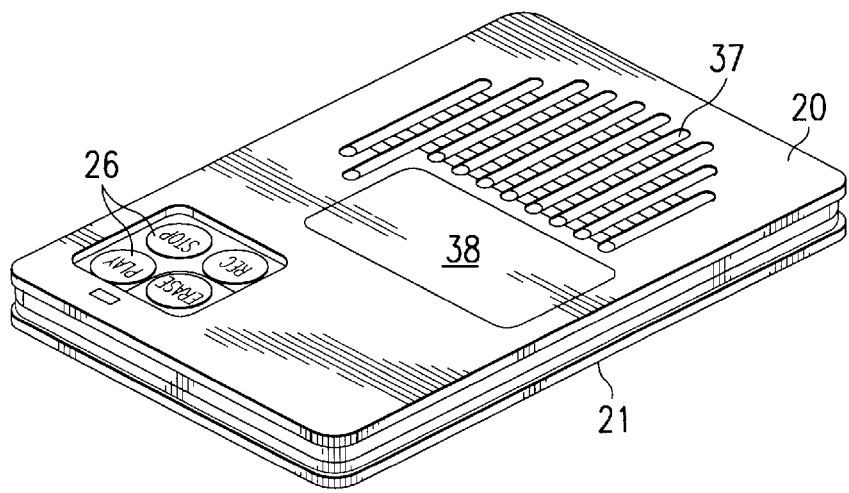
FIG. 8 is a perspective view of the assembled device of FIGS. 6 and 7, showing the side of the device carrying the operating buttons.

In FIG. 8 has been represented the device described with reference to FIGS. 6 and 7, fully mounted and returned so as to make it possible to appreciate the on/off switches 26 for controlling the device, a grid 37 made in the part 21 for the passage of the sound and a site 38 for the advertising messages.

Figure 9:
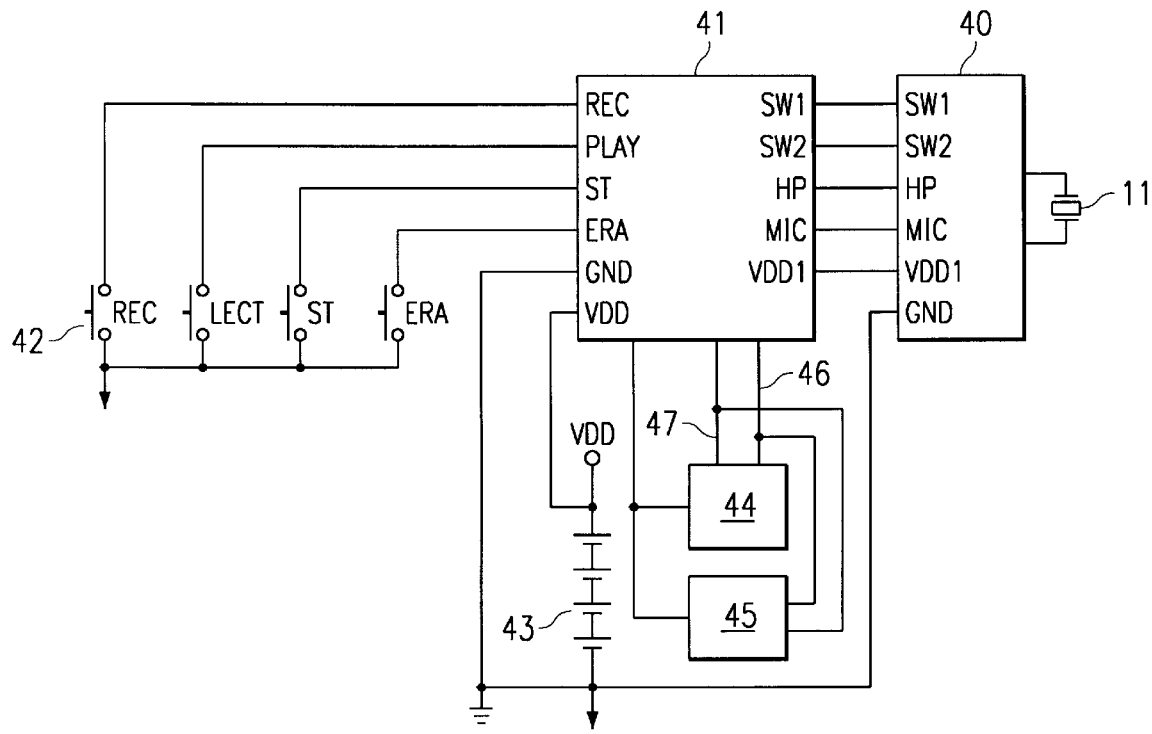
FIG. 9 is a block diagram of the electronic circuit of the device according to the invention.

In FIG. 9 has been represented the block diagram of the electronic circuit carried by the printed circuit card 2 of the device of FIG. 1 and 31 of the device of FIG. 6. This circuit includes the piezoelectric element 11 forming a microphone and a loudspeaker, the terminals of which are connected to corresponding terminals of a first pre-amplifier and amplifier integrated circuit 40.

Five terminals SW1, SW2, HP, MIC, VDD1 of the integrated circuit 40 are connected to five corresponding terminals of a voice coder 41.

A sixth terminal GND of the circuit 40 is connected to earth. The voice coder 41 includes control terminals connected to four on/off switches 42 which correspond to the on/off switches 26 of the device represented in FIG. 6.

These four on/off switches 42 control the record, play, stop and erase functions respectively.

The voice coder 41 is furthermore connected to the supply cells 43.

A memory 44 and its expansion 45 are furthermore associated with the voice coder 41 and are connected to the latter by an address 46 and data 47 bus.

Figure 10:
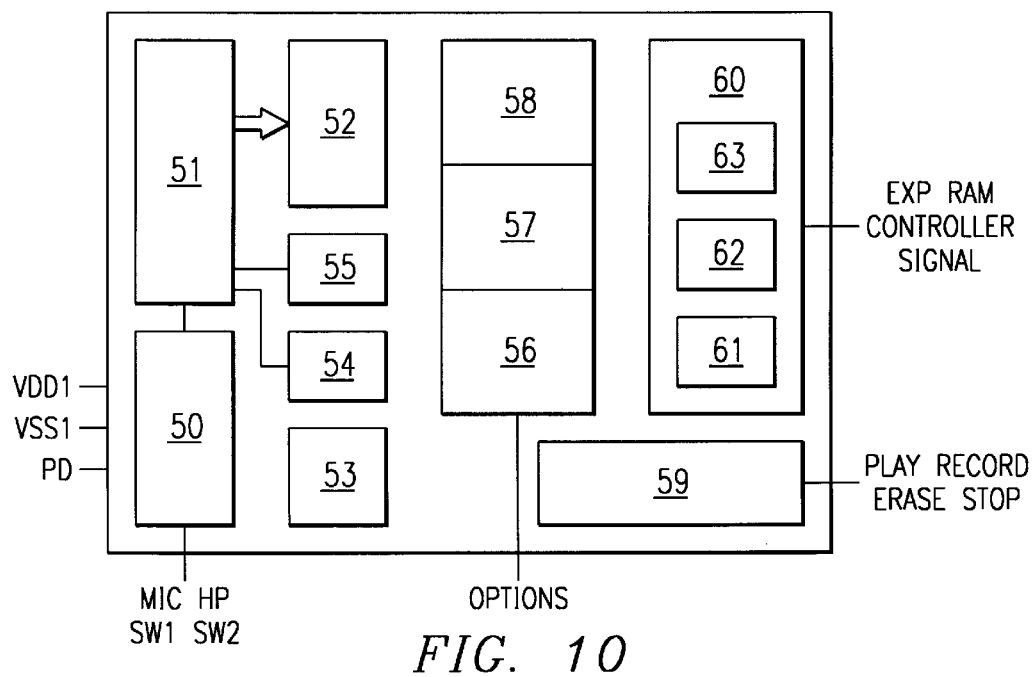
FIG. 10 is a more detailed block diagram of the circuit of FIG. 9.

In FIG. 10 has been represented in more detail the circuit of the voice coder 41 of the circuit of FIG. 9.

This coder which is of the type with continuously variable delta modulation is based on a high-fidelity digital logic. It includes an input/output control logic circuit 50 intended either to receive the signals from the piezoelectric element 11 when it operates as a microphone or to deliver output signals to the latter when it operates as a loudspeaker.

The input/output control circuit 50 is connected to an analog-digital converter 51 whose output is connected in turn to a comparator and data register circuit 52.

The input/output logic control circuit 50 is furthermore associated with a modulation control logic circuit 53 and connected to a syllabic integrator 54 and to an estimation integrator 55.

The circuit furthermore includes a mode register 56, a stoppage address register 57 and an address counter 58.

A keypad interface logic circuit 59 has an input connected to the on/off switches 42 for control of recording, of playing, of stoppage and of erasure.

A memory interface logic 60 comprising an eight-bit shift register 61, a 64×8 RAM memory buffer 62 and a flash code 27×8 ROM memory 63 complete this circuit.

The memory interface logic 60 generates the signals for monitoring and controlling the RAM memory and addressing and the data relating to this memory.

Figure 11:
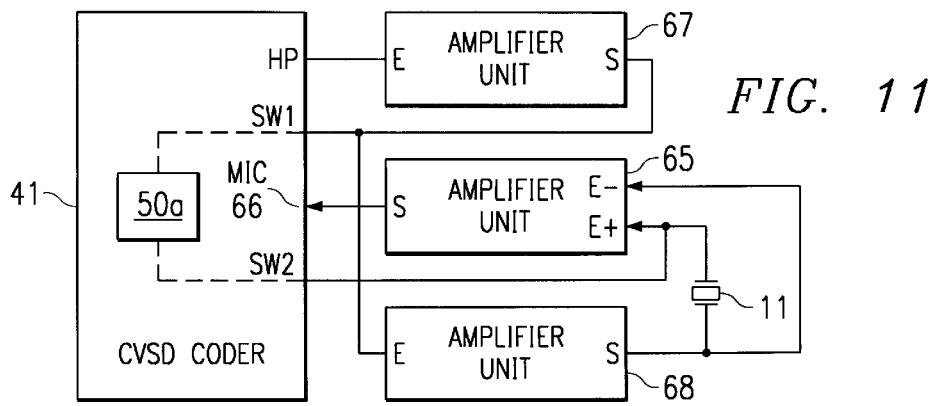
FIG. 11 is a more detailed block diagram of the circuit of FIG. 10 illustrating the operation of the device in record mode.

In FIG. 11 has been represented a more detailed block diagram of the pre-amplifier-amplifier 40 of FIG. 9.

This circuit includes principally: connected to a terminal of the piezoelectric element 11, an amplifying unit 65 with two inputs E−, E+.

The output S of this amplifying unit 65 is connected to a MIC input 66 of the coder 41. A second amplifier 67 is connected by its input terminal E to an output HP of the coder 41, whereas its output S is connected simultaneously to the input SW1 of an analogue switch 50a and to the inverting input of a third amplifier 68.

The piezoelectric element 11 is connected directly between the output SW2 of the analogue switch and the output S of the third amplifier 68.

In the present embodiment, the analogue switch 50a is connected between the outputs SW1 and SW2 of the coder 41 and integrated with the latter.

It can however be envisaged that this same function be carried out by a switch distinct from the coder circuit.

The problem posed in the present invention is to use the reversibility of the piezoelectric element 11 in order to make it operate in microphone and loudspeaker mode in the same set-up. This problem lies in the fact that when the piezoelectric element 11 is used in loud-speaker mode it must be driven by a system exhibiting an impedance lower than its own.

By contrast, when the piezoelectric element 11 is used in microphone mode, the circuit to which it is connected must exhibit an elevated impedance.

The solution implemented by the Applicant calls upon a TLC 274 TEXAS INSTRUMENTS package including four operational amplifiers, these amplifiers being connected so as to afford filtering and amplification of the signals in the manner just described with reference to FIG. 11.

Furthermore, the device of the invention calls upon a logic for control of an analogue switch fitted to the coding circuit 41 embodied by the input/output control logic circuit 50 in FIG. 10.

The operation of the device will now be described essentially with reference to FIG. 11.

With the device being used in record mode, when the piezoelectric element 11 is subjected to a mechanical vibration caused by speech, it converts this vibration into an electrical signal of low amplitude. The record mode of operation is initialised by actuation of the REN key 42 of the keypad of the device. The output SW2 of the voice coder is then placed in high impedance, by interrupting the path between the outputs SW1 and SW2 via the analogue switch 50a, in such a way as not to disturb the signal provided by the piezoelectric element 11 to the input E+.

The amplifier 65 is composed of two operational amplifiers, not represented, the first being used as low-pass filter. The use of this amplifier in differential mode makes it possible to escape from the residual voltage of the output S of the amplifier 67 always connected to the piezoelectric element 11. The second operational amplifier of the amplifier 65 used as level amplifier allows an adjustment of the signal presented on the MIC input 66 by modifying or adjusting a component.

The MIC input signal from the microphone is then coded by the voice coder 41 and the corresponding binary data are stored in the static memory 44 (FIG. 9) across the 64-byte buffer register 62 (FIG. 10).

The coding circuit 41 permits the use of several types of memory, including EEPROM flashes allowing the recorded message to be preserved even when the electrical supply constituted by the cells 24 of the embodiment of FIG. 7 is suppressed.

The operation of the device according to the invention in playback mode will now be examined.

When the piezoelectric element 11 is subjected to an electric voltage it converts the voltage signal into a mechanical vibration which, when it lies within a spectrum of audible frequencies, can be detected by the ear.

The playback mode of operation is effected by actuation of the PLAY key 42 (FIG. 9). A link with low impedance, less than 100 ohms, is established between the outputs SW1, SW2 of the coder 41, by the analogue switch 50a, as shown by the broken line in FIG. 11.

The coder 41 synthesises the coded signal stored in memory 44 and delivers this signal to the output HP. This signal is then amplified and low-pass filtered in the amplifier 68 and applied to the piezoelectric element 11 across the low-impedance link established between the outputs SW1 and SW2 of the coder 41. This same signal is also applied to the inverting amplifier 67 which exhibits a unit gain and which is connected to the other terminal of the piezoelectric element 11.

This connection of the two amplifiers 68 and 67 delivering, to the piezoelectric element 11, signals in phase opposition, enables the sound-restoring power of the set-up to be increased.

The use of operational amplifiers from the LinCMOS family, associated with a piezoelectric transducer, allows low current consumption during operation.

When off, the supply is disconnected by an external transistor, not represented, controlled by the output PD of the coder circuit 41 (FIG. 10).

By virtue of the configuration just described, it is seen that in the microphone mode, by virtue of the use of two operational amplifiers, the voice electric signal generated by the piezoelectric element is recovered differentially in order to be amplified and filtered within the frequency band of the channel (100 to 4000 Hz).

By virtue of the use of two operational amplifiers, a bridge amplifier is produced, enabling a voice signal to be transmitted across the piezoelectric element 11. This amplifier also effects a low-pass filtering in order to suppress the spectrum of frequencies greater than 4 KHz or other depending on the rating of the components used.

A single integrated circuit (TLC 27 4C) with a few discrete components is used to effect the low-pass filtering and the amplification functions.

The filters are of the first-order BUTTERWORTH type. Switching from microphone mode to playback mode is provided for as follows. The coder 41 also enables the piezoelectric element 11 to be switched to microphone or loudspeaker mode by virtue of the use of a single analogue switch. This has enabled this switch to be integrated within the coder 41, thus enabling a component gain to be obtained.

The use of a single piezoelectric element as microphone and as loudspeaker makes it possible to obtain apparatuses of the type described with reference to FIGS. 1 and 6. The speaking postcard represented in FIG. 1 is a low-cost solution with erase and play keys enabling a single message with a duration of 8 seconds or 16 seconds to be recorded and then listened to.

Figure 12:
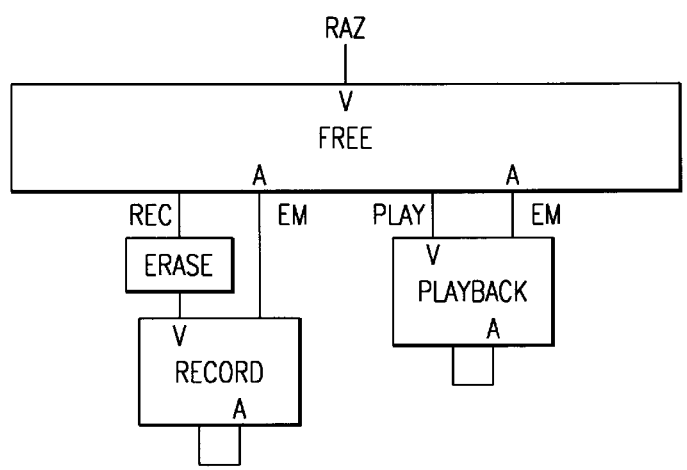
FIGS. 12 and 13 are respectively operating charts for the device according to the invention with two and four control buttons.
Figure 13:
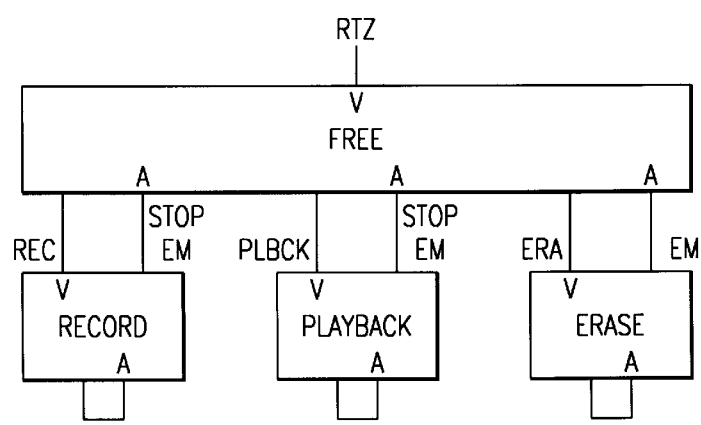

FIGS. 12 and 13 respectively represent operating charts for the device with two buttons such as that of FIG. 1 and with four buttons such as that of FIG. 6.

In the mode of use with two control buttons, the REC key invokes a steady low level on the input, REC which erases the entire memory, then starts the recording. The speech data are then recorded from the first address of the memory. Recording is stopped by detection of end of memory EM.

The PLAY key starts the playback of a previously recorded phase.

Listening is stopped at the end of the memory. The PLAY command is always executed from the start of the message.

In the mode of use with four controls, represented in FIG. 13, the REC key invokes a steady low level on the REC input which starts recording.

The speech data are then recorded from the page following the address contained in the STOP register (multiple messages).

Recording is stopped by the STOP command or the detection of end of memory EM.

The PLAY key starts playback of the previously recorded messages. Listening is stopped by a STOP command or the end of the memory. The PLAY command is always executed from the start of the message.

The STOP key stops the record or play function in progress and puts the circuit into low consumption.

The ERA key erases the entire memory.

In standby mode, a high level appears on the terminal PD, which is the terminal for control of an external transistor, not shown, inserted into the supply circuit so as to limit the consumption by the circuit assembly.

The dimensions of this device enable it to be incorporated in a postcard.

The memento represented in FIG. 6 takes the form of a small plastic package of the size of a credit card. By the use of four keys, record, play, erase, stop, it enables several consecutive messages to be recorded and listened to, the total of the messages being from 8 to 64 seconds.

Other applications may be envisaged for such devices, without departing from the scope of the invention.

We claim:

1. A miniaturized device for receiving and playing back sound comprising:

a combination sound pick-up microphone and playback loudspeaker defined by the same piezoelectric component operable as a microphone in a first mode and as a loudspeaker in a second mode;

a power source;

electronic circuitry connecting said combination sound pick-up microphone and playback loudspeaker to the power source; and said electronic circuitry including impedance-altering circuitry operable to provide an impedance at an elevated magnitude with respect to the piezoelectric component when the piezoelectric component is employed in the first mode as a microphone;

said impedance-altering circuitry being further operable to provide an impedance at a lower magnitude with respect to the piezoelectric component to drive the piezoelectric component when the piezoelectric component is employed in the second mode as a loudspeaker, wherein said electronic circuitry includes a printed circuit board separate from said piezoelectric component and having integrated circuit means provided thereon defining respective record and play channels connected to the said piezoelectric component and further including a support plate on which each of said piezoelectric component and said printed circuit board are respectively disposed;

an outer peripheral frame of non-conductive adhesive foam material arranged along the peripheral margin of said support plate and surrounding said piezoelectric component and said printed circuit board a non-conductive protective sheet fixed to said outer peripheral adhesive foam frame along one marginal edge thereof and adapted to overlie said outer peripheral adhesive foam frame and said piezoelectric component and said printed circuit board located within said adhesive foam frame;

further including first and second control switches respectively connected to said printed circuit board to control the record channel and the play channel provided by the integrated circuit means thereon; and a non-conductive sheet of adhesive foam material mounted on the back of said printed circuit board and having a notch defined therein for receiving said first and second control switches.

2. A miniaturized device for receiving and playing back sound as set forth in claim 1, wherein said power source comprises at least one battery cell connected to said printed circuit board; and further including a substantially flat segmental housing of card-like thickness made of insulating material and having top and bottom housing parts;

the bottom housing part being provided with a first compartment in which said at least one battery cell and said control switches are disposed, and a second compartment for receiving said piezoelectric component;

said printed circuit board being mounted within the boundaries of said bottom housing part;

the top housing part overlying said bottom housing part and in registration therewith;

said top housing part and said bottom housing part being releasably secured together to define the substantially flat segmental housing of card-like thickness within which said piezoelectric component, said printed circuit board, said control switches, and said at least one battery cell are enclosed.

3. The device for receiving and playing back sound of claim 1 wherein said device is a miniaturized sound recording and playback device.

4. A miniaturized device for receiving and playing back sound comprising:

a combination sound pick-up microphone and playback loudspeaker defined by the same piezoelectric component operable as a microphone in a first mode and as a loudspeaker in a second mode;

a power source;

electronic circuitry connecting said combination sound pick-up microphone and playback loudspeaker to the power source; and said electronic circuitry including impedance-altering circuitry operable to provide an impedance at an elevated magnitude with respect to the piezoelectric component when the piezoelectric component is employed in the first mode as a microphone;

said impedance-altering circuitry being further operable to provide an impedance at a lower magnitude with respect to the piezoelectric component to drive the piezoelectric component when the piezoelectric component is employed in the second mode as a loudspeaker, wherein said electronic circuitry includes a printed circuit board separate from said piezoelectric component and having integrated circuit means provided thereon defining respective record and play channels connected to the said piezoelectric component, a voice coder connected to said piezoelectric component; and memory means connected to said voice coder for storing sound data received from said piezoelectric component when operating in the first mode as a microphone and wherein said integrated circuit means on said printed circuit board includes a pre-amplifier-amplifier circuit connected to said piezoelectric component and to said voice coder; and control switch means connected to said power source and to said voice coder for regulating the operation of the sound recording and playback device as between the first and second modes.

5. A miniaturized device for receiving and playing back sound as set forth in claim 4, wherein said pre-amplifier—amplifier circuit comprises a first amplifier having first and second inputs connected to respective terminals of said piezoelectric component and having an output connected to a microphone input of said voice coder;

a second amplifier connected to an output of said voice coder;

a third amplifier;

the output of said second amplifier being connected to the input of said third amplifier and to one terminal of said piezoelectric component;

an analog switch disposed in the connection between the output of said second amplifier and the input of said third amplifier and said one terminal of said piezoelectric component;

said third amplifier having an output connected to the terminal of said piezoelectric component corresponding to an input of said first amplifier;

said first amplifier being connected to the terminals of said piezoelectric component in a differential mode when said piezoelectric component is employed in the first mode as a microphone for recording sound data in said memory means; and said second and third amplifiers being connected in phase opposition when said piezoelectric component is employed in the second mode as a loudspeaker so as to deliver signals in phase opposition to the piezoelectric component.

6. A miniaturized device for receiving and playing back sound as set forth in claim 5, wherein the input of said voice coder to said piezoelectric component is provided with an elevated impedance in response to the actuation of said control switch means when the piezoelectric component is employed in the first mode as a microphone; and a low-impedance link being established between the outputs of said voice coder connected respectively to the input of said second amplifier and to the output of said third amplifier and to the positive input of said first amplifier in response to the closing of said analog switch when the piezoelectric component is employed in the second mode as a loudspeaker.

* * * * *